(12) United States Patent
Nagamatsu

(10) Patent No.: US 6,876,681 B2
(45) Date of Patent: Apr. 5, 2005

(54) LIGHT SOURCE COMPRISING LASER DIODE MODULE

(75) Inventor: Shinya Nagamatsu, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 85 days.

(21) Appl. No.: 09/961,686

(22) Filed: Sep. 21, 2001

(65) Prior Publication Data
US 2002/0064194 A1 May 30, 2002

(30) Foreign Application Priority Data
Nov. 24, 2000 (JP) ........................................ 2000-357679

(51) Int. Cl.⁷ .............................. H01S 3/04; H01L 23/34
(52) U.S. Cl. .............................. 372/34; 372/35; 372/36; 257/712
(58) Field of Search .............................. 372/34–36, 43, 372/50; 362/373, 259; 257/712, 713, 714

(56) References Cited

U.S. PATENT DOCUMENTS

| | | | |
|---|---|---|---|
| 3,995,332 A | | 12/1976 | Forchini et al. |
| 4,580,623 A | | 4/1986 | Smitte et al. |
| 4,638,854 A | * | 1/1987 | Noren ........................... 165/76 |
| 4,729,076 A | * | 3/1988 | Masami et al. ............. 362/235 |
| 5,068,865 A | | 11/1991 | Ohshima et al. |

FOREIGN PATENT DOCUMENTS

| | | | |
|---|---|---|---|
| EP | 0 268 523 | | 5/1988 |
| JP | 55117607 | * | 3/1982 |
| JP | 60-153188 | | 8/1985 |
| JP | 04-179180 | | 6/1992 |
| JP | 05-167143 | | 7/1993 |
| JP | 05167143 | * | 7/1993 |
| JP | 405167143 | * | 7/1993 |

* cited by examiner

*Primary Examiner*—Minsun Harvey
*Assistant Examiner*—Armando Rodriguez
(74) *Attorney, Agent, or Firm*—Oblon, Spivak, McClelland, Maier & Neustadt, P.C.

(57) ABSTRACT

A light source comprising a plurality of laser diode modules, wherein a plurality of high optical power laser diode modules are arranged in high density, each of the plurality of high optical power laser diode modules includes a metal substrate mounting a laser diode chip and an optical instrument thereon; a Peltier device thermally connected to the metal substrate; a heat pipe having a heat absorbing portion and a heat dissipating portion in which the heat absorbing portion is thermally connected to the Peltier device and a heat dissipating fin is provided on the heat dissipating portion; and a heat pipe reinforcing member to hold the heat dissipating fin and reinforce a strength of the heat pipe.

23 Claims, 8 Drawing Sheets (b)

(a)

(c)

(a)

(b)

(c)

(d)

(a)

(b)

(a)

(b)

LIGHT SOURCE COMPRISING LASER DIODE MODULE

BACKGROUND OF THE INVENTION

1. Field of the Invention

The present invention relates to a high power light source, in particular to a light source comprising a plurality of high power laser diode modules arranged in high density.

2. Related Art

In general, a laser diode module is used as a signal light source for an optical fiber communication, particularly a trunk line system—CATV or an excitation light source for a fiber amplifier. In order to achieve a high power and a stable operation, the laser diode module includes a built-in Peltier device, and in addition, optical parts such as a laser diode chip, a photodiode chip, lens or the like as well as electric parts such as a thermistor component, inductor, resistor or the like are arranged on a metal substrate mounted on the upper part of the Peltier device.

The above-mentioned Peltier device comprises a thermoelectric semiconductor. More specifically, when a DC current is supplied thereto, heat is transferred in the current flow direction, in case of p-type semiconductor, and heat is transferred in the direction opposite to the current flow, in case of n-type semiconductor, thus a temperature difference occurs at both ends of the thermoelectric semiconductor. The cooling system employing the Peltier device implements cooling (i.e., heat absorption) at the low temperature side thereof and heat dissipation at the high temperature side thereof, taking advantages of the property of the above-mentioned temperature difference.

The laser diode module detects the temperature of the chip by means of a thermistor element adhered to the vicinity of the above-mentioned laser diode chip. The laser diode module has a structure in which the Peltier device is driven through the feedback of thus detected temperature value to cool the whole metal substrate where the laser diode chip is arranged, thus keeping the temperature of the laser diode chip constant.

Japanese Patent Provisional Publication No. 10-200205 discloses a semiconductor laser module provided with a metal substrate comprising two kinds of metallic material.

However, in recent years, a higher cooling capacity and a higher temperature-environmental reliability (i.e., ability to sustain a normal function even when the temperature varies) of the laser diode module are demanded more and more strongly according to the realization of the higher power in the laser diode module.

SUMMARY OF THE INVENTION

A light source comprising a plurality of laser diode modules, wherein a plurality of high optical power laser diode modules are arranged in high density, each of said plurality of high optical power laser diode modules includes a metal substrate mounting a laser diode chip and an optical instrument thereon; a Peltier device thermally connected to said metal substrate; a heat pipe having a heat absorbing portion and a heat dissipating portion in which said heat absorbing portion is thermally connected to said Peltier device and a heat dissipating fin is provided on said heat dissipating portion; and a heat pipe reinforcing member to hold said heat dissipating fin and reinforce a strength of said heat pipe.

A heat pipe having a heat absorbing portion and a heat dissipating portion, at least one heat dissipating fin being thermally connected to said heat dissipating portion, and a heat pipe reinforcing member for holding said heat dissipating fin and reinforcing a strength of said heat pipe being provided on said heat dissipating fin.

DETAILED DESCRIPTION OF THE PREFERRED EMBODIMENTS

One of the object of the present invention is therefore to provide a light source comprising a plurality of high optical power laser diode modules densely arranged, which can be stored under the thermal environment of a temperature up to 0° C.

The inventors have studied intensely in order to solve the above-mentioned problems of the prior art. As a result, it is found that although the use of a heat pipe in the laser diode module or other highly precise device has been denied or rejected in the conventional art due to the association caused by the leakage of the working fluid or moisture thereof which deteriorates the highly precise devices because a liquid named as working fluid is contained therein, when a heat pipe which has the property of a heat conductivity of about at least 20 times of the monocrystalline diamond is connected to the Peltier device, it is possible to remarkably reduce the possibility of the damage in Peltier device to effectively function a high power laser diode module, and furthermore, to obtain a densely arranged high power laser diode modules.

More specifically, it is found that a light source comprising a plurality of highly reliable and high optical power laser diode modules can be obtained by thermally connecting the heat absorbing portion of the heat pipe to the respective Peltier devices in laser diode modules each of which includes a metal substrate mounting a laser diode chip and optical equipment thereon, and a Peltier device thermally connected to the metal substrate, even when a plurality of laser diode modules respectively having a high optical power are arranged highly densely, because the respective laser diode module can be cooled by the scale incomparable to the prior art.

Figure 6:
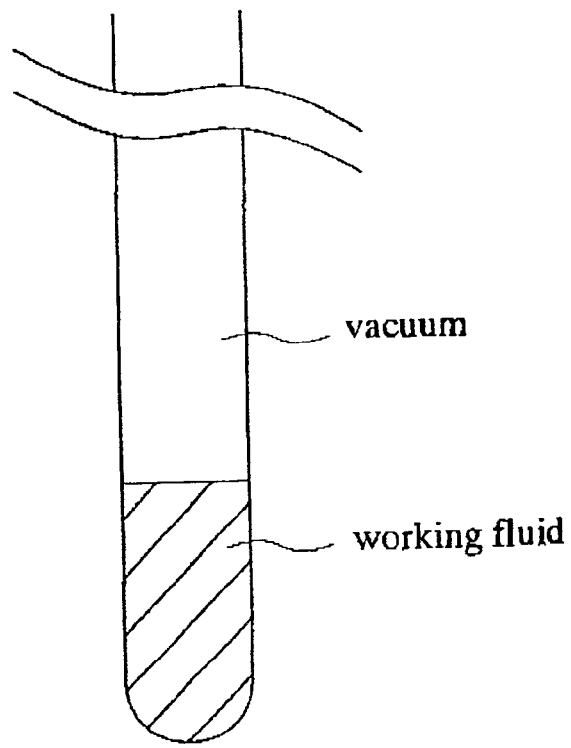
FIG. 6(a) shows a vertically placed heat pipe.
FIG. 6(b) shows a horizontally placed heat pipe.
Figure 6:
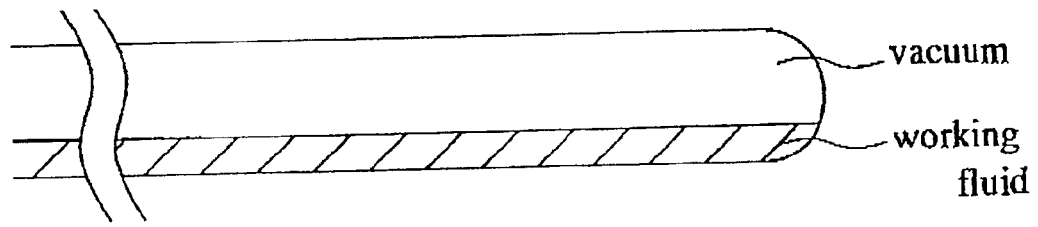
Figure 7:
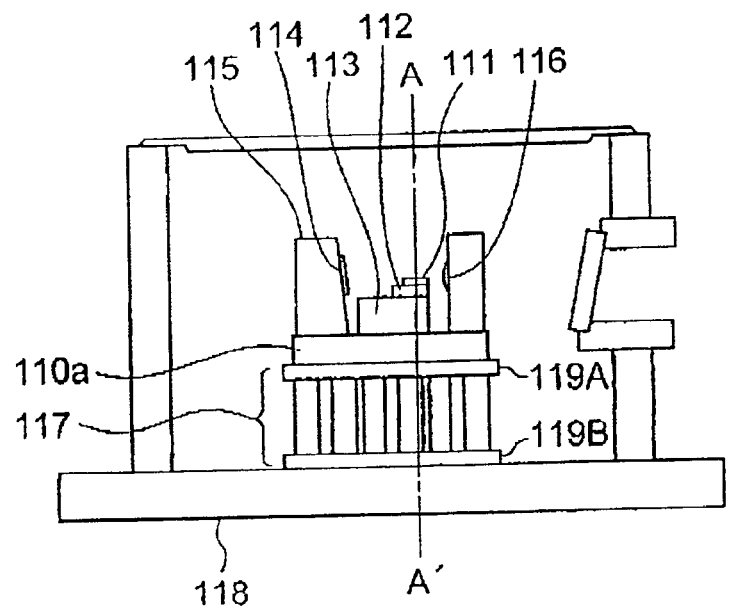
FIG. 7 is a schematic view illustrating a laser diode module of the prior art.
Figure 8:
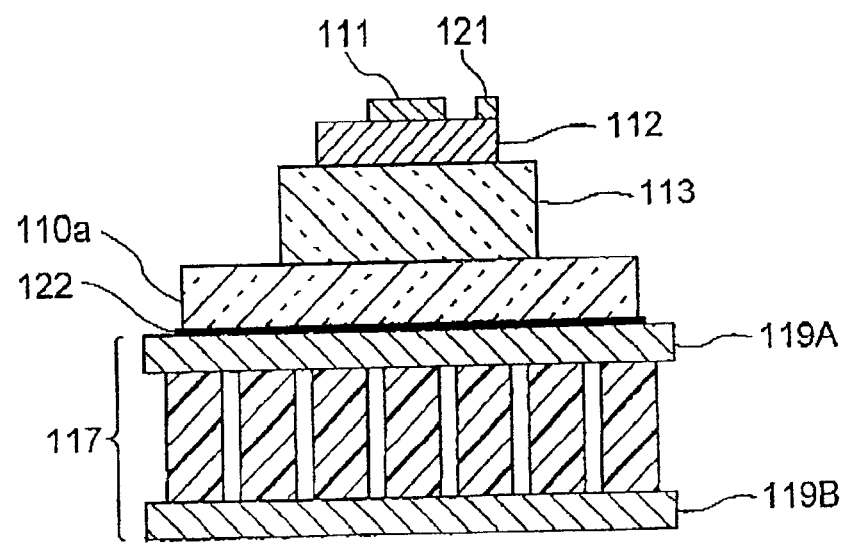
FIG. 8 is a schematic cross-sectional view along A–A' line of the laser diode module depicted in FIG. 7.
Figure 9:
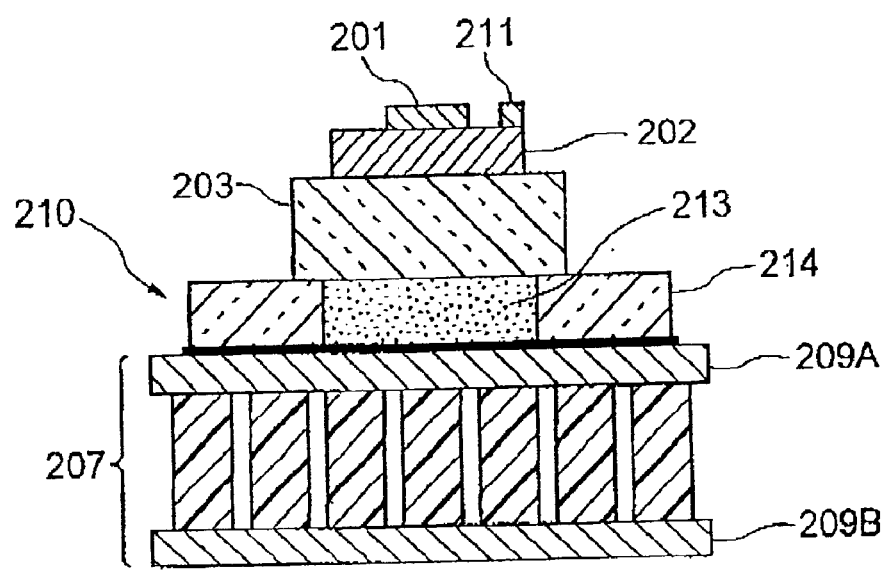
FIG. 9(a) is a schematic cross-sectional view of a semiconductor module of the prior art.
FIG. 9(b) is a schematic perspective view of a metal substrate in the semiconductor module of the prior art.
Figure 9:
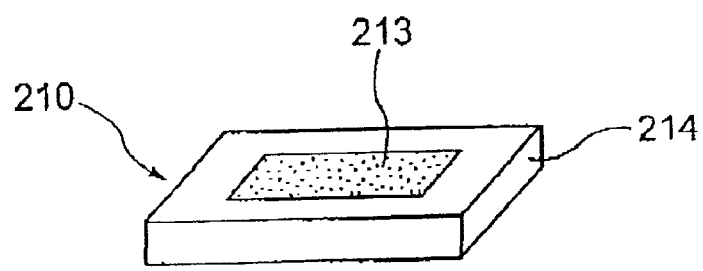

Moreover, when cooper is used as material for preparing the heat pipe, and water as working fluid, water freezes at the temperature up to 0° C., increasing the possibility of causing the heat pipe to be burst, thus, the heat pipe has been avoided from being used in the laser diode module or other highly precise equipment, as mentioned above. As shown in FIG. 6(b), if the head pipe is placed horizontally all the time, there remains a room even when the working fluid freezes and dilates, the heat pipe hardly bursts. However, as shown in FIG. 6(a), if the heat pipe is placed vertically, water collected at the bottom portion of the heat pipe freezes first at the surface thereof, and the freeze progresses to the remaining portion in the bottom portion in such manner as being blocked by the frozen surface as if covered by a lid. The heat pipe breaks when the pressure of the freeze exceeds the rupture strength of the material of the heat pipe.

In order to prevent the breakage of the heat pipe, it was found that the freezing does not destroy the heat pipe even if the working fluid freezes at an temperature up to 0° C., when the burring is applied to the heat dissipating fin by means of the press for press-fitting the heat pipe, and further a SUS ring is fitted to the portion to which the calking is applied, and then calked again during the process in which the heat dissipating fin is fitted to the heat pipe.

The present invention has been developed on the basis of the above-mentioned findings.

Now, embodiments of the light source comprising laser diode modules of the present invention will be described in detail with reference to drawings.

Figure 1:
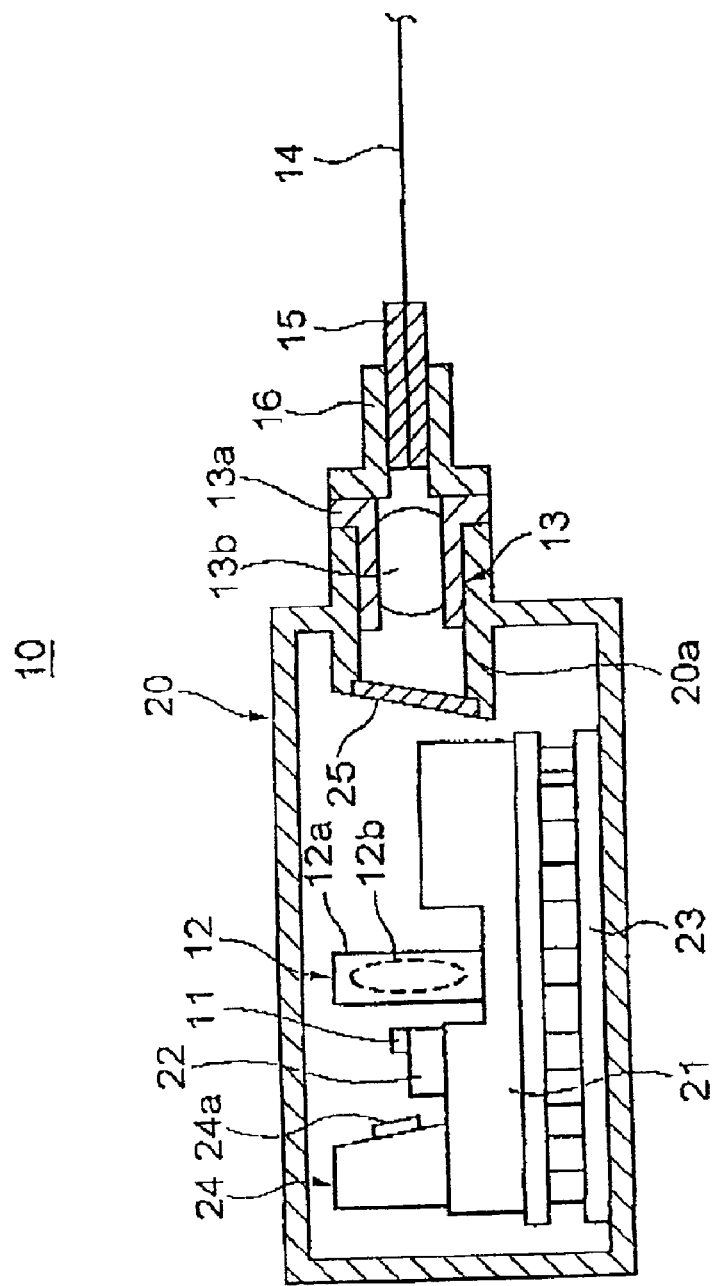
FIG. 1 is a schematic view illustrating an example of laser diode modules constructing a light source of the present invention.

One of the embodiment of the light source of the invention comprises a light source comprising a plurality of laser diode modules, wherein a plurality of high optical power laser diode modules are arranged in high density, each of said plurality of high optical power laser diode modules includes a metal substrate mounting a laser diode chip and an optical instrument thereon; a Peltier device thermally connected to said metal substrate; a heat pipe having a heat absorbing portion and a heat dissipating portion in which said heat absorbing portion is thermally connected to said Peltier device and a heat dissipating fin is provided on said heat dissipating portion; and a heat pipe reinforcing member to hold said heat dissipating fin and reinforce a strength of said heat pipe, FIG. 1 is a schematic view showing an example of a laser diode module constructing a light source of the present invention. As shown in FIG. 1, a laser diode module 10 includes a semiconductor laser 11, a first lens 12, a second lens 13, a core enlarged fiber 14 and a hermetic case 20. The semiconductor laser 11 is installed on a base 21 through a chip carrier 22 with a predetermined distance apart from the first lens 12. The base 21 is arranged on a Peltier device 23 for effecting temperature control which is disposed in the hermetic case 20. The base 21 comprises a composite material made of copper for an essential part thereof, and of stainless steal for a portion where the first lens 12 is installed. A carrier 24 is fixed on the base member 21 in one side which is positioned opposite to the first lens 12 with the chip carrier 22 positioned therebetween, and a photo diode 24a for monitoring is installed on the side portion of the carrier 24, facing toward the semiconductor laser 11.

In the first lens 12, a collimator lens 12b is held by a lens holder 12a. The lens holder 12a is fixed by welding to the base 21. An aspheric lens is used for the collimator lens 12b in order to obtain a high binding efficiency. In the second lens 13, a spherical lens 13b of which upper and lower portions are scraped away is held by a lens holder 13a. The lens bolder 13a is position-adjusted in a plane vertical to the optical axis, and affixed to an insertion cylinder 20a of the hermetic case 20 described hereunder As for core enlarged fiber 14, the core enlarged end side thereof is ground in slant by inclining by 6 degrees in respect to the optical axis, and the ground surface is coated with anti-reflection agent, and the end side is adhered in a metal tube 15 and protected. The metal tube 15 is fixed by welding to an adjustment member 16 at an optimal position thereof. The metal tube 15 is adjusted so as to take the optimal position in relation to the adjustment member 16 by sliding forward and backward along the optical axis of the core enlarged fiber 14, or rotating around the optical axis within the adjustment member 16.

Figure 2:
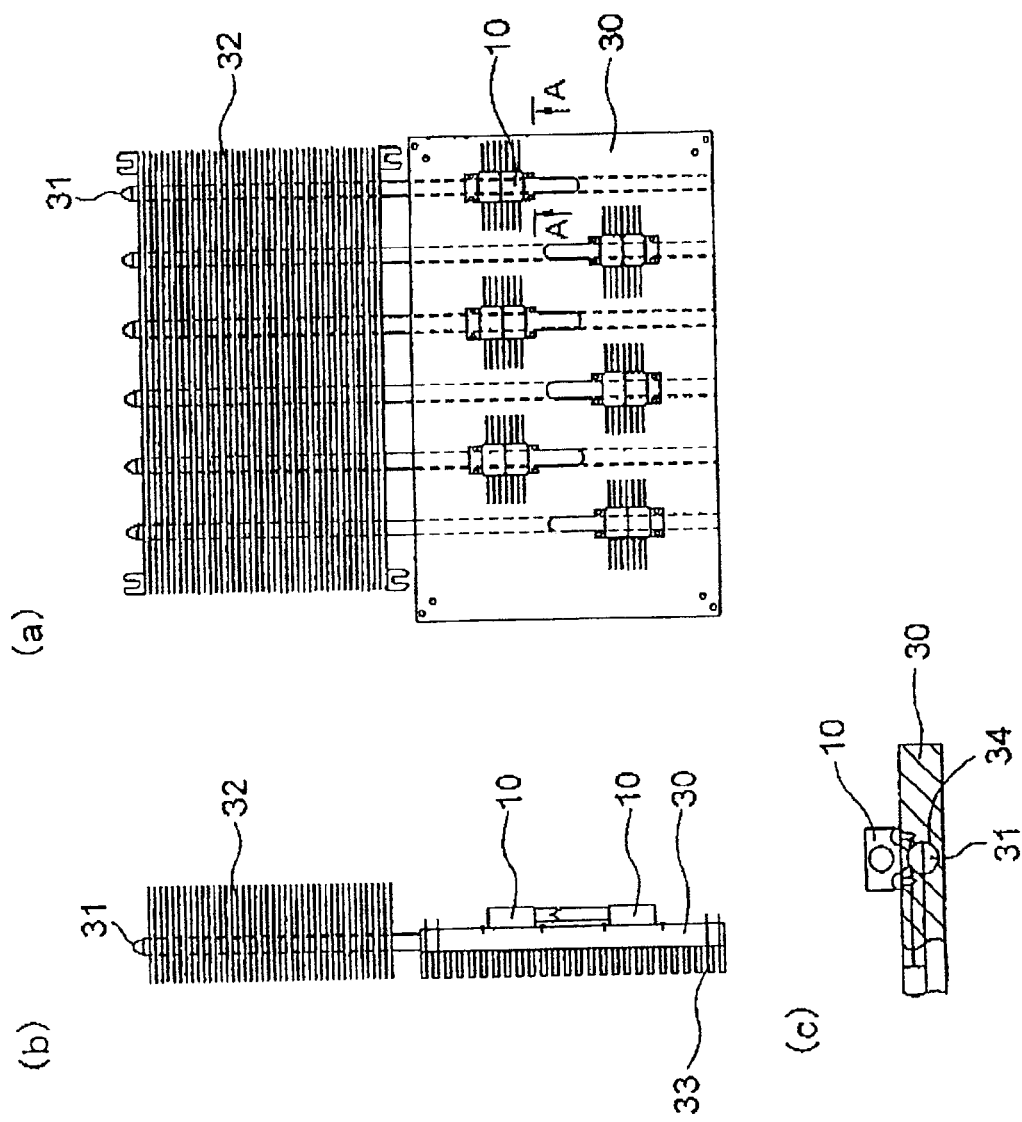
FIG. 2(a) is a top view of an embodiment of the light source comprising laser diode modules.
FIG. 2(b) is a side view of an embodiment of the light source comprising laser diode modules.
FIG. 2(c) is a cross-sectional view along A–A' line in FIG. 2(a)
Figure 3:
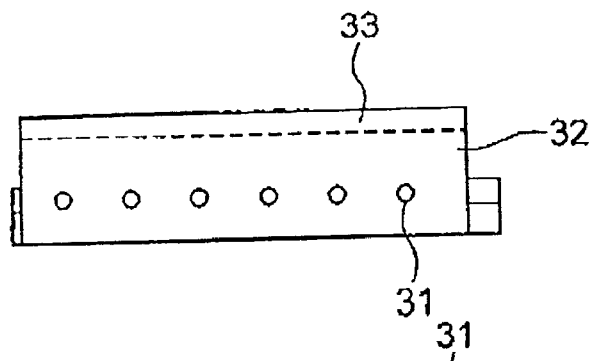
FIG. 3(a) is a back view of an embodiment of the light source.
FIG. 3(b) is a side view of an embodiment of the light source viewed from the side of the heat dissipating fin.
FIG. 3(c) is a side view of an embodiment of the light source viewed from the side of the loading portion.
Figure 3:
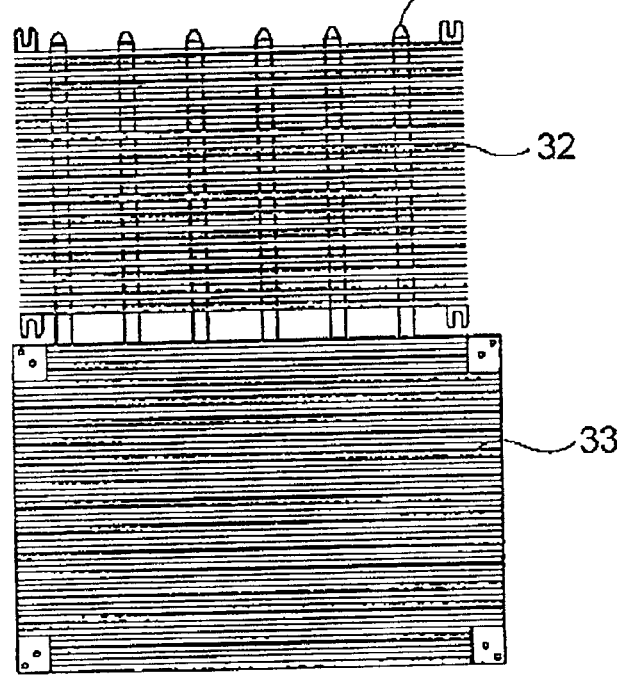
Figure 3:
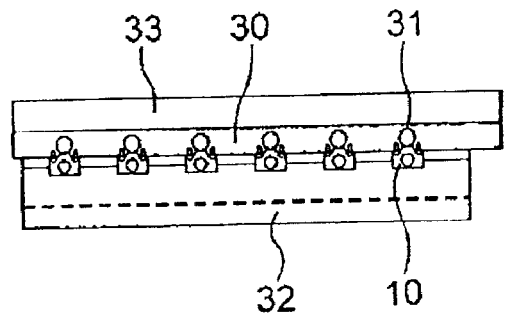

FIG. 2 shows an embodiment of a light source comprising laser diode modules of the present invention. FIG. 2(a) is a top view of an embodiment of the light source comprising laser diode modules. FIG. 2(b) is a side view of an embodiment of the light source comprising laser diode modules. FIG. 2(c) is a cross-sectional view along A–A' line in FIG. 2(a). FIG. 3 is a backside view of an embodiment of the light source comprising laser diode modules. FIG. 3(a) is a back view of an embodiment of the light source. FIG. 3(b) is a side view of an embodiment of the light source viewed from the side of the heat dissipating fin. FIG. 3(c) a side view of an embodiment of the light source viewed from the side of the loading portion.

As shown in FIG. 2(a), in this embodiment, six laser diode modules 10 are disposed on a loading portion 30 in parallel to the lateral axis of the loading portion. Adjacent laser diode modules 10 are separated each other by a predetermined distance, and form two groups of laser diode modules respectively comprising three laser diode modules in parallel to the longitudinal axis of the loading portion. The above-described arrangement of the laser diode modules enables to densely arrange the laser diode modules.

The light source comprising laser diode modules of the present invention is, as described above, a light source comprising a plurality of high optical output laser diode modules densely arranged. Preferably, the optical output of respective laser diode module is at least 100 mW.

The arrangement density of laser diode modules can be increased as much as physically possibly arranged. More specifically, laser diode modules can be arranged not only on a horizontal plane, but also in the vertical direction.

A heat absorbing portion of the heat pipe 31 is disposed in the loading portion 30, and a heat dissipating fin 32 is disposed on the heat dissipating portion of the heat pipe.

In general, the heat pipe includes a container having a hermetically sealed hollow portion, and heat is transferred through a phase transformation and transfer of a working fluid contained in the hollow portion. A part of the heat is directly transferred through the material forming the container of the heat pipe, whereas most of the heat is transferred through the phase transformation and transfer of the working fluid.

In the heat absorbing side of the heat pipe to which a component to be cooled is attached, the working fluid is evaporated by the heat directly transferred through the material of the container of the heat pipe, and the thus evaporated working fluid moves towards the heat dissipating side of the heat pipe. In the heat dissipating side, the evaporated working fluid is cooled and condensed to the liquid phase thereof. The working fluid returned to the liquid phase moves back to the heat absorbing side of the heat pipe. The heat is transferred though such phase transformation and transfer of the working fluid.

The heat pipe 31 may comprise a round type heat pipe. The respective laser diode module comprises, as shown in FIG. 1, a metal substrate 21 mounting a laser diode chip 11 and an optical instrument 12, and a Peltier device 23 thermally connected to the metal substrate 21. Furthermore, the Peltier device 23 is thermally connected to a heat absorbing portion of a heat pipe 31 In the light source comprising laser diode modules of the present invention, the heat pipe 31 is thermally connected to the respective laser diode module 10, as shown in FIG. 2(a).

FIG. 2(c) is a cross-sectional view along A–A' of FIG. 2(a) as described above. As shown in FIG. 2(c), in the light source comprising laser diode modules of the present invention, a plurality of hole portion 34 for receiving the heat absorbing portion of the heat pipe are disposed in the loading portion 30 for mounting the plurality of laser diode modules 10 along the longitudinal direction of the respective laser diode modules. The heat pipe 31 received in the hole portion 34 is thermally connected to the laser diode module 10.

The hole portion 34 for receiving the heat absorbing portion of the heat pipe is perforated, and the inner surface of the hole portion is plated by tin, gold or other metals presenting a good affinity with the solder. The surface of the heat pipe to be inserted into the hole portion 34 is plated in advance by the same metal as the above-described metals having excellent soldering property. Thus plated heat pipe 31 is inserted into the hole portion 34, and soldered. As a result, air layers increasing the heat resistance can be removed completely, thus reducing the heat resistance. When a small air layer remains between the heat pipe and the hole portion, a heat insulation layer is locally formed, thus increasing the heat resistance. and considerably decreasing the heat transfer of the heat pipe.

Furthermore, in the light source comprising laser diode modules of the present invention, the bottom surface portion of the laser diode module includes a bent surface portion, and the round type heat pipe is connected in close contact to the bent surface portion. As shown in FIG. 2(c), the bottom portion of the laser diode module 10 is worked so as to be entered into the loading portion 30. Since the bottom surface portion of the laser diode module includes the bent surface portion, the bottom portion of the laser diode module 10 is connected in close contact to the heat pipe 31 inserted in the loading portion 30, in other words, a direct contact is made between the bottom portion of the laser diode module and the surface of the heat pipe 31.

As described above, it is preferable to prepare a structure in which a central portion of the laser diode module is positioned so as to be nearest to the embedded heat pipe. As a result, the heat generated from the laser diode module can be highly effectively transferred to the heat pipe.

As described above, FIG. 2(b) is a side elevational view of the light source comprising laser diode modules of the present invention. As shown in FIG. 2(b), another heat dissipating fin 33 is attached onto the back surface (namely, bottom surface) of the loading portion 30 mounting a plurality of laser diode modules. Since another heat dissipating fin 33 is attached onto the bottom surface of the loading portion 30, the heat generated from densely arranged laser diode modules is mainly transferred rapidly to the heat dissipating side of the heat pipe 31 and dissipated into the atmosphere through the heat dissipating fin 32 fixed thereto, and partially transferred to another heat dissipating fin 33 attached onto the bottom surface of the loading portion 30 and dissipated therethrough into the atmosphere. Consequently, even when the optical output of the respective laser diode modules is further enhanced, and moreover, even when high optical output laser diode modules are densely arranged, the heat generated from the light source comprising laser diode modules can be efficiently dissipated. Accordingly, the Peltier device arranged in the laser diode module is prevented from being destroyed, and the laser diode chip 11 can be maintained within a predetermined temperature range to continues to efficiently function, thus a high performance of the light source can be maintained.

Figure 4:
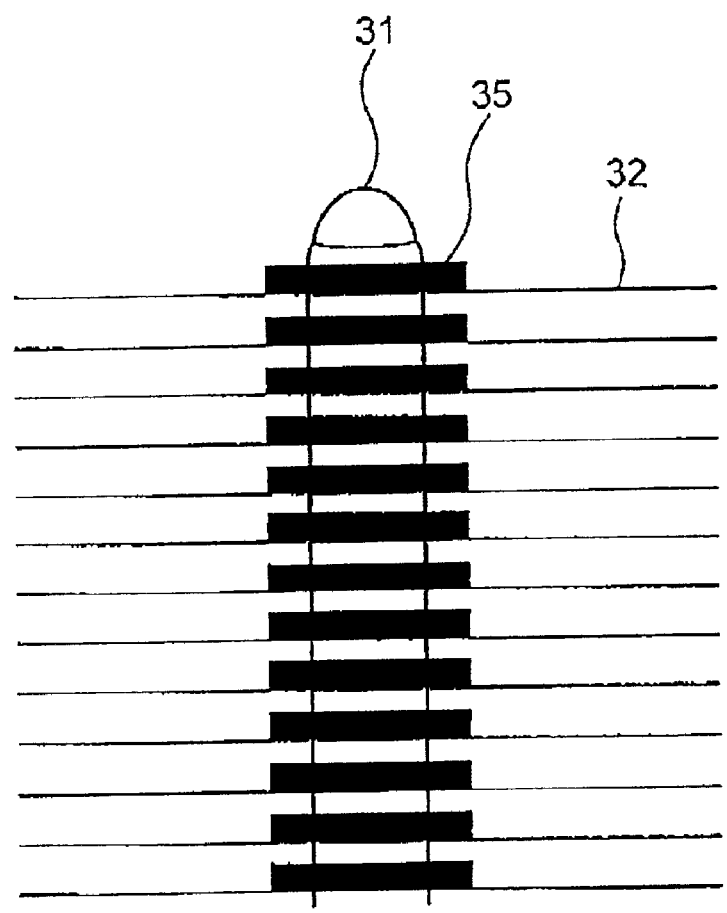
FIG. 4 is a schematic enlarged view of a heat pipe 31 of the present invention provided with heat dissipating fins 32.
Figure 5:
FIG. 5(a) shows an aluminum plate.
FIG. 5(b) shows a cylindrical hole portion formed in the aluminum plate.
FIG. 5(c) shows a heat pipe arranged in the cylindrical hole portion of the plate.
FIG. 5(d) shows a reinforcing member tightly pinch-held on the cylindrical hole portion around the heat pipe.
Figure 5:
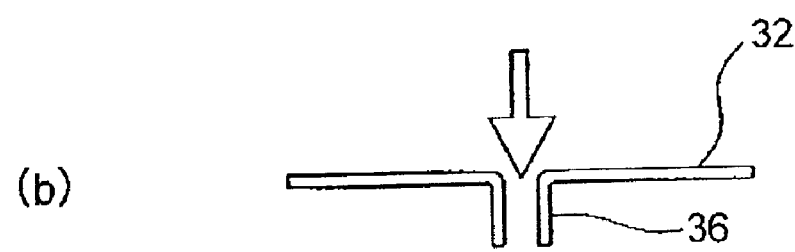
Figure 5:
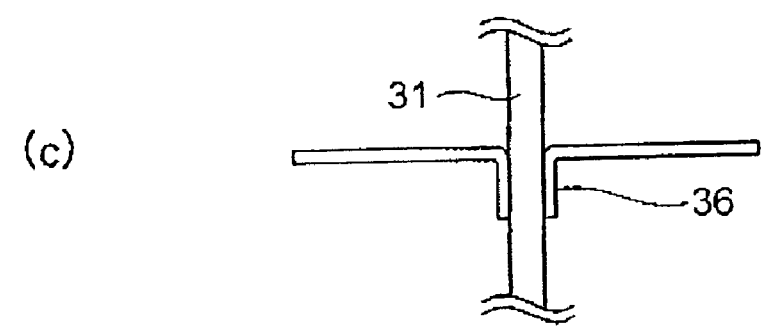
Figure 5:
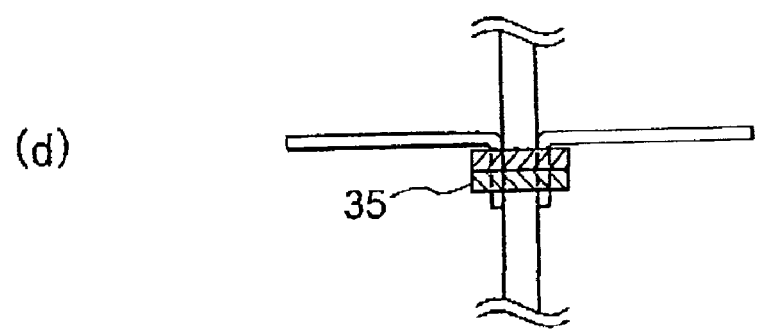

FIG. 4 is an enlarged partial view of the heat dissipating portion of the heat pipe 31 with heat dissipating fins 32 fixed thereto in the light source comprising laser diode modules of the present invention. FIG. 5 is a schematical view showing a method for attaching the heat dissipating fin to the heat pipe.

An aluminum plate 32 is prepared as shown in FIG. 5(a), and a cylindrical hole portion 36 is formed by means of burring with the use of pressing as shown in FIG. 5(b). The heat pipe 31 is press-fitted into the thus formed cylindrical hole portion 36, and then the cylindrical hole portion 36 is calked, Furthermore, a ring-shaped pipe reinforcement member (for example, SUS ring) is fitted onto the calked cylindrical hole portion, and then further calked.

As shown in FIG. 4, the respective heat pipe is provided with the heat dissipating fins and the ring-shaped pipe reinforcement member, as described above with reference to FIG. 5, thus the rupture strength of the heat pipe is considerably improved.

The ring-shaped pipe reinforcement member is a ring made of a material having an excellent rupture strength, for example, iron base material, fiber reinforced plastic, or the like. When the calking is performed only by a conventional burring, the calked state are different in the heat dissipating fins, since the heat dissipating fin per se is thin, thus some heat dissipating fins are firmly calked with other heat dissipating fins insufficiently calked. However, when a ring-shaped pipe enforced member formed by the above-mentioned material having an excellent rupture strength of the present invention, is fitted onto the heat dissipating fin and calked again, the pressure in the pressed surface of the respective heat dissipating fins becomes even. Accordingly, the heat resistance can be remarkably reduced and becomes constant. Furthermore, the break down of the heat pipe due to the frozen and expanded working fluid can be effectively prevented. When a temperature up to 0° C. is expected during the storage, the break down of the heat pipe can more securely be prevented by keeping the heat pipe as in a state shown in FIG. 6(b), namely, in a state where the heat pipe is horizontally positioned, The loading portion is preferably made of aluminum.

The heat pipe is preferably a round type heat type made of cooper, and then, water can be used as working fluid. A wick may be disposed within the heat pipe to facilitate the circulation of the working fluid. The shape of the round type heat pipe may be round, oval, flat, or the like.

The light source comprising laser diode modules of the present invention is used as an optical excitation light source for an optical transmission system. In addition, the light source comprising laser diode modules of the present invention is used as an optical signal light source for an optical transmission system.

Furthermore, the Raman amplifier of the present invention is a Raman amplifier using the light source comprising laser diode modules of the present invention.

Moreover, in the heat pipe of the present invention, the heat dissipating fins are attached to the heat dissipating portion of the heat pipe (the heat pipe is press-fitted into the heat dissipating fin), and furthermore, a reinforcing member is provided onto the heat dissipating fin to pinch-hole the heat dissipating fin around the heat pipe, thus reinforcing the heat pipe. Heat dissipating fins are connected thermally to the heat dissipating portion of the heat pipe. More specifically, as shown in FIG. 5(c) and FIG. 5(b), the heat dissipating fin 32 is provided with a cylindrical portion 36 which surrounds the outer circumferential portion of the heat pipe 31. A reinforcing member 35 tightly pinch-holds the cylindrical portion 36 of the heat dissipating fin 32 around the heat pipe 31. The above-mentioned cylindrical portion is not limited to a cylindrical shape, but can be appropriately selected in accordance with the shape of the heat pipe.

Consequently, according to the heat pipe of the present invention, it is possible to increase remarkably the heat pipe destruction resistance and, further, assure an excellent thermal connection and mechanical connection between the heat dissipating fin and the heat pipe by providing the reinforcement member.

In addition, a Raman amplifier of the invention comprises a light source including: at least one laser diode module including a metal substrate mounting a laser diode chip and an optical component, and a peltier device thermally connected with the metal substrate; a heat pipe having a heat absorbing portion and a heat dissipating portion, the heat absorbing portion of the heat pipe being thermally connected with the peltier device; a heat dissipating fin provided on the heat dissipating portion; and a heat pipe reinforcing member to hold the heat dissipating fin and reinforce a strength of the heat pipe.

Furthermore, a light source of the invention comprises: a laser diode module including a laser diode chip, an optical component, and a peltier device, the laser diode chip and the optical component being supported by the peltier device; a mounting portion having the peltier device mounted thereon such that the peltier device is thermally connected with the mounting portion; at least one heat pipe having a first portion extending within the mounting portion and a second portion extending from a side of the mounting portion, the heat pipe having an interior with a heat transfer fluid therein; a heat dissipating fin provided on the second portion; and a heat pipe reinforcing member to hold the heat dissipating fin and reinforce a strength of the heat pipe.

In the light source of the invention, the mounting portion is made of a metal. The light source of the invention further comprises a plurality of densely placed laser diode modules, each of the plurality of densely placed laser diode modules having an output of at least 100 mW The light source of the invention further comprises a plurality of laser diode modules each including a metal substrate mounting a laser diode chip and an optical component, and a peltier device thermally connected with the metal substrate. The light source of the invention further comprises a plurality of heat pipes, each of the plurality of heat pipes being thermally connected with a respective one of the plurality of laser diode modules, In the light source of the invention, the mounting portion has holes configured to receive heat absorbing portions of the plurality of heat pipes along a lengthwise direction of the respective one of the plurality of laser diode modules, the respective one of the plurality of laser diode modules being thermally connected with a respective one of the plurality of heat pipes received in the holes. In the light source of the invention, the heat pipe is cylindrical in shape. In the light source of the invention, the laser diode module has a bottom portion that includes a curved surface portion, and the heat pipe is tightly connected to the curved surface portion.

The light source of the invention further comprises a plurality of heat radiating fins provided on a bottom surface of the mounting portion. In the light source of the invention, the light source is a light source for optical excitation used in an optical transmission system. In the light source of the invention, the light source is a light source for optical signal used in an optical transmission system.

EXAMPLE

Now, the light source comprising laser diode modules of the present invention will be described by an example.

A loading portion made of aluminum having a size of 130 mm length×190 mm width×20 mm height is prepared. Along the width direction of the loading portion, hole portions to receive the heat pipe are formed with 28 mm of space apart from each other at the center in the height direction of the loading portion, as shown in FIG. 2(c). Each of the inner surface of the hole portion is plated with tin. The outer surface of the heat pipe to be inserted into the hole portion 34 is plated in advance with the same metal as the above-mentioned metal having excellent property for being soldered. A copper round heat pipe having an outer diameter of 6.35 mm is prepared and the outer surface of the heat pipe to be inserted in the hole portion is plated with tin. Then, the heat absorbing portion of the heat pipe is inserted in the hole portion, and the heat pipe and the loading portion are soldered. There are formed concave portions in the respective portions on the upper surface of the loading portion where the laser diode modules are disposed, each of which concave portions receives the bottom portion of the laser diode module. A bent surface portion is formed on the bottom portion of the laser diode module, and the bottom portion of the laser diode module comes into a direct and close contact with the outer surface of the heat pipe through conductive grease, as shown in FIG. 2(c).

Plate type heat dissipating fins each having 180 mm length×40 mm width×0.4 mm thickness, as shown in FIG. 2(a), are attached to the round type heat pipe extending from the loading portion where laser diode module is arranged, in parallel to the width direction of the loading portion. Furthermore, a stainless steal ring is attached to the respective heat dissipating fin as shown in FIG. 4 and FIG. 5.

Moreover, a corrugated fin of 11 mm height and 3 mm pitch is metal bonded by brazing to the opposite side (namely, bottom side) of the loading portion on which the laser diode modules are mounted, as shown in FIG. 2(c).

In addition, six laser diode modules are arranged in a configuration as shown in FIG. 2(a). The optical output power of the individual laser diode module is 100 mW.

Water as a working fluid is contained within the heat pipe, and wire-shaped wick is arranged within the heat pipe.

When the light source comprising laser diode modules of the present invention thus prepared is operated, a high optical output power of at least 200 mW can be obtained, and at the same time the laser diode module can be maintained within a temperature range of 24.9 to 25.1° C.

As described above, a high heat dissipating property can be obtained, since the round type heat pipe and the loading portion are metal bonded in such manner that the round type heat pipe comes in direct contact with the bottom portion of the laser diode module. As a result, it is possible to realize a compact and high optical output power light source used for an optical excitation or for optical signal, keeping the power consumption thereof low.

In addition, the heat pipe was not burst or broken, even when it was stored under the temperature of −50° C. for 10 thousands hours.

COMPARATIVE EXAMPLE

For the purpose of comparison, a loading portion is prepared in the same manner as the loading portion in the above example was prepared excluding the heat pipe, and laser diode modules are arranged on the loading portion. Thus prepared light source comprising laser diode modules for comparison was operated However, the individual laser diode module could not deploy its performance to full extension, since the cooling efficiency of the light source was not effective. Accordingly, in order to deploy its performance to full extension, only three laser diode modules were able to be disposed on the loading portion. It is therefore impossible to obtain a high optical output power light source comprising a plurality of laser diode modules arranged in high density.

As is clear from the above, according to the present invention, it becomes possible to remarkably improve the heat dissipating property of the optical light source, while securing the safety in the state of a low heat resistance as well as overcoming the risk of the break out of the heat pipe due to the freezing and expanding of the working fluid at the low temperature. As a result, the performance of an optical light source using a high output power LDM of at least several hundreds mW can be highly improved.

EFFECTS OF THE INVENTION

According to the present invention, the heat resistance between the heat pipe and the heat dissipating fin can be remarkably lowered and stabilized, and in addition, the risk of the burst of the heat pipe at the temperature of up to 0° C. due to the freezing and expanding of the working fluid can be overcome, since the portion prepared by burring and calking of the heat dissipating fin is firmly held to the heat pipe by means of the calking ring made of material having excellent rupture strength.

Consequently, according to the present invention, it is possible to provide a light source comprising a plurality of laser diode modules arranged in high density and having a high optical output power, and it is possible to realize a compact and high optical output power light source used for an optical excitation or for optical signal, keeping the power consumption thereof low, thus the industrial use value is high

What is claimed is:

1. A light source comprising:
   a plurality of laser diode modules, wherein a plurality of high optical power laser diode modules are arranged in high density, each of said plurality of high optical power laser diode modules includes a metal substrate mounting a laser diode chip and an optical instrument thereon;
   a Peltier device thermally connected to said metal substrate;
   a heat pipe having a heat absorbing portion and a heat dissipating portion in which said heat absorbing portion is thermally connected to said Peltier device and a heat dissipating fin is provided on said heat dissipating portion; and
   a heat pipe reinforcing member configured to contact and pinch-hold said heat dissipating fin against said heat pipe, so as to reinforce a strength of said heat pipe, said reinforcing member having a ring-shape.

2. The light source as claimed in claim 1, wherein an optical power of each of said laser diode modules is at least 100 nW.

3. The light source as claimed in claim 1, wherein a heat pipe is thermally connected to each of said laser diode modules.

4. The light source as claimed in claim 3, wherein said plurality of laser diode modules are mounted on a mounting portion, a hole portion for receiving said heat absorbing portion of said heat pipe is disposed in said mounting portion in a longitudinal direction of said laser diode module, and said heat pipe received in said hole portion and said laser diode module are thermally connected.

5. The light source as claimed in claim 4, wherein said heat pipe comprises a round type heat pipe, a bottom face portion of said laser diode module includes a bent surface portion, and said round type heat pipe is closely connected to said bent surface portion of said laser diode module.

6. The light source as claimed in claim 4 or 5, wherein at least one another heat dissipating fins are provided on a bottom surface of said mounting portion.

7. The light as claimed in claim 6, wherein said light source is an optical excitation light source in an optical transmission system.

8. The light source as claimed in claim 6 wherein said light source is an optical signal light source in the optical transmission system.

9. A Ramian amplifier comprising:
   a light source comprising a plurality of laser diode modules, wherein a plurality of high optical power laser diode modules are arranged in high density, each of said plurality of
   high optical power laser diode modules includes a metal substrate mounting a laser diode chip and an optical instrument thereon;
   a Peltier device thermally connected to said metal substrate;
   a heat pipe having a heat absorbing portion and a heat dissipating portion in which said heat absorbing portion is thermally connected to said Peltier device and a heat dissipating fin is provided on said heat dissipating portion; and
   a heat pipe reinforcing member configured to contact and pinch-hold said heat dissipating fin against said heat pipe so as to reinforce a strength of said heat pipe, wherein
   at least one another heat dissipating fins are provided on a bottom surface of said mounting portion,
   a heat pipe is thermally connected to each of said laser diode modules, and
   said plurality of laser diode modules are mounted on a mounting portion, a hole portion for receiving said heat absorbing portion of said heat pipe is disposed in said mounting portion in a longitudinal direction of said laser diode module, and said heat pipe received in said hole portion and said laser diode module are thermally connected said reinforcing member having a ring-shape.

10. A heat pipe comprising:
a heat absorbing portion;
a heat dissipating portion coupled to said heat absorbing portion;
at least one heat dissipating fin being thermally connected to said heat dissipating portion; and
a heat pipe reinforcing member for pinch-holding said heat dissipating fin against said heat pipe so as to reinforce a strength of said heat pipe being provided on said heat dissipating fin, said reinforcing member having a ring-shave.

11. A heat pipe as claimed in claim 10, wherein said heat dissipating fin has a cylindrical portion so as to surround the outer circumference of said heat pipe, and said reinforcement member holds said cylindrical portion of said heat dissipating fin to press against said outer circumference of said heat pipe.

12. A Raman amplifier comprising a light source compnsrng:
at least one laser diode module including a metal substrate mounting a laser diode chip and an optical component, and a peltier device thermally connected with said metal substrate;
a heat pipe having a heat absorbing portion and a heat dissipating portion, said heat absorbing portion of said heat pipe being thermally connected with said peltier device;
a heat dissipating fin provided on said heat dissipating portion; and
a heat pipe reinforcing member configured to pinch-hold said heat dissipating fin against said heat pipe and reinforce a strength of said heat pipe said reinforcing member having a ring-shape.

13. A light source comprising:
a laser diode module including a laser diode chip, an optical component, and a peltier device, said laser diode chip and said optical component being supported by said peltier device;
a mounting portion having said peltier device mounted thereon such that said peltier device is thermally connected with said mounting portion;
at least one heat pipe having a first portion extending within said mounting portion and a second portion extending from a side of said mounting portion, said heat pipe having an interior with a heat transfer fluid therein;
a heat dissipating fin provided on said second portion; and
a heat pipe reinforcing member configured to pinch-hold said heat dissipating fin against said heat pipe and reinforce a strength of said heat pipe, said reinforcing member having a ring-shape.

14. The light source according to claim 13, wherein said mounting portion is made of a metal.

15. The light source according to claim 13, further comprising a plurality of densely placed laser diode modules, each of said plurality of densely placed laser diode modules having an output of at least 100 mW.

16. The light source according to claim 13, further comprising a plurality of laser diode modules each including a metal substrate mounting a laser diode chip and an optical component, and a peltier device thermally connected with said metal substrate.

17. The light source according to claim 16, further comprising a plurality of heat pipes, each of said plurality of heat pipes being thermally connected with a respective one of said plurality of laser diode modules.

18. The light source according to claim 17, wherein said mounting portion has holes configured to receive heat absorbing portions of said plurality of heat pipes along a lengthwise direction of said respective on of said plurality of laser diode modules, said respective one of said plurality of laser diode modules being thermally connected with a respective one of said plurality of heat pipes received in said holes.

19. The light source according to claim 13, wherein said heat pipe is cylindrical in shape.

20. The light source according to claim 19, wherein said laser diode module has a bottom portion that includes a curved surface portion, and wherein said heat pipe is tightly connected to said curved surface portion.

21. The light source according to claim 13, further comprising a plurality of heat radiating fins provided on a bottom surface of said mounting portion.

22. The light source according to claim 13, wherein said light source is a light source for optical excitation used in an optical transmission system.

23. The light source according to claim 13, wherein said light source is a light source for optical signal used in an optical transmission system.

* * * * *